(12) United States Patent
Tabirian et al.

(10) Patent No.: US 9,195,072 B2
(45) Date of Patent: Nov. 24, 2015

(54) CONTACT LENSES WITH EMBEDDED LABELS

(71) Applicant: Johnson & Johnson Vision Care, Inc., Jacksonville, FL (US)

(72) Inventors: Nelson Tabirian, Winter Park, FL (US); Rafael Vergara Toloza, Winter Park, FL (US); Russell Spaulding, Saint Johns, FL (US)

(73) Assignee: Johnson & Johnson Vision Care, Inc., Jacksonville, FL (US)

( * ) Notice: Subject to any disclaimer, the term of this patent is extended or adjusted under 35 U.S.C. 154(b) by 114 days.

(21) Appl. No.: 13/950,389

(22) Filed: Jul. 25, 2013

(65) Prior Publication Data

US 2015/0029459 A1 Jan. 29, 2015

(51) Int. Cl.
| | | |
|---|---|---|
| G02C 7/04 | (2006.01) | |
| G02C 7/02 | (2006.01) | |
| G03F 7/26 | (2006.01) | |
| B32B 37/24 | (2006.01) | |
| B32B 37/00 | (2006.01) | |
| B32B 38/00 | (2006.01) | |
| B32B 43/00 | (2006.01) | |
| G02B 1/04 | (2006.01) | |

(52) U.S. Cl.
CPC .............. *G02C 7/021* (2013.01); *B32B 37/025* (2013.01); *B32B 37/24* (2013.01); *B32B 38/0008* (2013.01); *B32B 43/006* (2013.01); *G02B 1/043* (2013.01); *G02C 7/04* (2013.01); *G03F 7/26* (2013.01); *B32B 2037/243* (2013.01); *B32B 2038/0068* (2013.01); *B32B 2305/55* (2013.01); *B32B 2307/418* (2013.01); *B32B 2310/0806* (2013.01); *B32B 2551/00* (2013.01)

(58) Field of Classification Search
CPC ....................................................... G02C 7/049
USPC .............. 351/159.28, 159.25, 159.24, 159.26
See application file for complete search history.

(56) References Cited

U.S. PATENT DOCUMENTS

| | | | |
|---|---|---|---|
| 6,024,448 A | 2/2000 | Wu | |
| 6,042,230 A | 3/2000 | Neadle | |
| 6,643,001 B1 | 11/2003 | Faris | |
| 7,018,041 B2* | 3/2006 | Odhner | 351/159.26 |
| 8,820,924 B2* | 9/2014 | Spaulding et al. | 351/159.28 |
| 8,911,080 B2* | 12/2014 | Spaulding et al. | 351/159.28 |
| 2001/0013921 A1 | 8/2001 | Wu | |

(Continued)

FOREIGN PATENT DOCUMENTS

| | | |
|---|---|---|
| EP | 0947872 B1 | 5/2009 |
| EP | 2221592 A1 | 8/2010 |

(Continued)

OTHER PUBLICATIONS

European Search Report for Application No. 14178412.4-1301 dated Feb. 2, 2015.

*Primary Examiner* — Hung Dang
(74) *Attorney, Agent, or Firm* — Carl J. Evens

(57) ABSTRACT

An ophthalmic lens incorporating clearly identifiable, highly visible embedded labels that are not visible to the wearer or others when placed on the eye may be utilized to allow an individual to easily distinguish between the normal state of the lens and the inverted state of the lens as well as serve any number of functions, including acting as a brand label, a prescription label or as a cosmetic enhancer. The embedded label comprises holographic recordings revealed only in transmitted light.

8 Claims, 14 Drawing Sheets

(56) References Cited

U.S. PATENT DOCUMENTS

2005/0270474 A1 12/2005 Odhner
2009/0141216 A1 6/2009 Marrucci
2011/0170055 A1 7/2011 Enerson
2011/0262844 A1 10/2011 Tabirian

FOREIGN PATENT DOCUMENTS

| JP | 63163321 A | 7/1988 |
| WO | WO 2004/025562 A1 | 3/2004 |
| WO | WO 2011/010267 A1 | 2/2011 |
| WO | WO2014164599 A1 | 10/2014 |

* cited by examiner

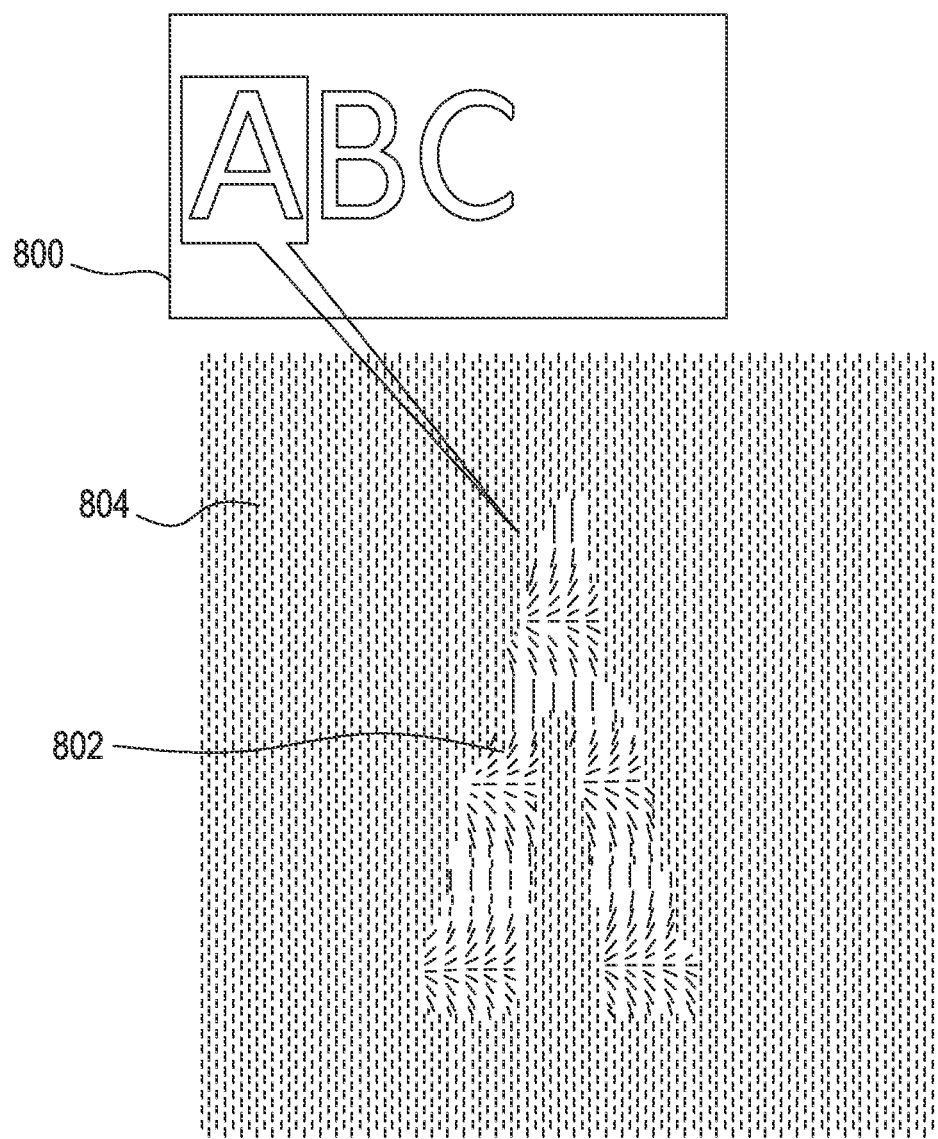

CONTACT LENSES WITH EMBEDDED LABELS

BACKGROUND OF THE INVENTION

1. Field of the Invention

The present invention relates to ophthalmic lenses, and more particularly to contact lenses incorporating one or more embedded structures that are sensitive to the direction of incident light and which may be utilized for a number of purposes, including as an inversion marker, as a prescription label, as a brand label and/or as a cosmetic enhancer. These structures diffuse light across a range of angles so that the structures may be seen across that same range of angles, effectively providing excellent visibility regardless of the viewing angle.

2. Discussion of the Related Art

Myopia or nearsightedness is an optical or refractive defect of the eye wherein rays of light from an image focus to a point before they reach the retina. Myopia generally occurs because the eyeball or globe is too long or the cornea is too steep. A minus or negative powered spherical lens may be utilized to correct myopia. Hyperopia or farsightedness is an optical or refractive defect of the eye wherein rays of light from an image focus to a point after they reach or behind the retina. Hyperopia generally occurs because the eyeball or globe is too short or the cornea is too flat. A plus or positive powered spherical lens may be utilized to correct hyperopia. Astigmatism is an optical or refractive defect in which an individual's vision is blurred due to the inability of the eye to focus a point object into a focused image on the retina. Astigmatism is caused by an abnormal curvature of the cornea. A perfect cornea is spherical whereas in an individual with astigmatism, the cornea is not spherical. In other words, the cornea is actually more curved or steeper in one direction than another, thereby causing an image to be stretched out rather than focused to a point. A cylindrical lens rather than a spherical lens may be utilized to resolve astigmatism.

Contact lenses may be utilized to correct myopia, hyperopia, astigmatism as well as other visual acuity defects. Contact lenses may also be utilized to enhance the natural appearance of the wearer's eyes. Contact lenses or contacts are simply lenses placed on the eye. Contact lenses are considered medical devices and may be worn to correct vision and/or for cosmetic or other therapeutic reasons. Contact lenses have been utilized commercially to improve vision since the 1950s. Early contact lenses were made or fabricated from hard materials, were relatively expensive and fragile. In addition, these early contact lenses were fabricated from materials that did not allow sufficient oxygen transmission through the contact lens to the conjunctiva and cornea which potentially could cause a number of adverse clinical effects. Although these contact lenses are still utilized, they are not suitable for all patients due to their poor initial comfort. Later developments in the field gave rise to soft contact lenses, based upon hydrogels, which are extremely popular and widely utilized today. Specifically, silicone hydrogel contact lenses that are available today combine the benefit of silicone, which has extremely high oxygen permeability, with the proven comfort and clinical performance of hydrogels. Essentially, these silicone hydrogel based contact lenses have higher oxygen permeabilities and are generally more comfortable to wear than the contact lenses made of the earlier hard materials.

Contact lenses need to be thin and flexible for wearer comfort. Such flexibility may result in contact lens inversion upon handling. Essentially, contact lens inversion occurs when the corneal or back curve side of the contact lens inverts and becomes the front curve side of the lens due to handling in some manner. Accordingly, if the contact lens is placed on the eye in an inverted state, the desired vision correction and comfort are not achieved. Thus, there is a need for marking the contact lenses such that their normal state may be easily distinguished from the inverted state. In order not to affect the aesthetic and optical properties of the contact lens, the currently utilized inversion marker is preferably made in the form of a small number series positioned at the periphery of the contact lens. This makes the marker barely visible thereby requiring special effort and adequate illumination to locate and identify it. Accordingly, there exists a need for an inversion marker, which may include multiple symbols and/or characters, which are highly visible and easily identifiable when the contact lens is out of the eye, but disappears or is optically invisible when placed on the eye.

Contact lenses may also be difficult to identify. For example, without the packaging, it is difficult to identify the manufacturer of particular lenses. In addition, without the packaging it would be difficult to determine prescription strength and this is especially problematic for individuals whose prescriptions differ from one eye to the other. In other words, the left eye contact lens should be placed in the left eye and the right eye contact lens should be placed in the right eye. Accordingly, it may be particularly advantageous to have contact lenses with embedded indicia. The embedded indicia may function as an inversion marker as described above, as a prescription label, as a brand label, as a cosmetic enhancer and/or any other suitable function. A brand label is not only useful for brand recognition, but also to prevent and deter counterfeiting. Preferably, the embedded indicia is highly visible when off the eye but invisible to both the wearer and others when on the wearer's eyes without affecting the optical properties of the lens or its aesthetics.

SUMMARY OF THE INVENTION

The contact lenses with embedded labels in accordance with the present invention overcome the disadvantages associated with the prior art as briefly set forth above.

In accordance with one aspect, the present invention is directed to an ophthalmic lens with an embedded label. The ophthalmic lens comprises a contact lens, and one or more embedded structures that are sensitive to the direction of incident light incorporated into the contact lens.

In accordance with another aspect, the present invention is directed to an ophthalmic lens with an embedded label. The ophthalmic lens comprises a contact lens, and one or more embedded structures that influence the propagation of light incident on the contact lens.

In accordance with yet another aspect, the present invention is directed to a method of fabricating a label for embedding in a secondary object. The method comprises the steps of depositing a photaligning release material onto a substrate, aligning the photaligning release material with a linearly polarized light to create a homogenous background on the substrate, arranging a mask on a predetermined position in front of the substrate, exposing the homogenous background on the substrate to interfering light beams of orthogonal polarization states through the mask, coating the substrate with a reactive liquid crystal film, polymerizing the reactive liquid crystal film, releasing the polymerized liquid crystal polymer film from the substrate, and transferring at least a portion of the released film to the secondary object.

In accordance with yet still another aspect, the present invention is directed to a method for fabricating a label for embedding in a secondary object. The method comprises the steps of depositing a photaligning release material onto a substrate, aligning the photaligning release material with a linearly polarized light to create a homogenous background on the substrate, arranging a masked diffractive waveplate in front of the homogenous background on the substrate, exposing the homogenous background on the substrate to a single light beam through the masked diffractive waveplate, coating the homogenous background on the substrate with a reactive liquid crystal film, polymerizing the reactive liquid crystal film, releasing the polymerized liquid crystal film from the substrate and transferring at least a portion of the released film to the secondary object.

In accordance with still another aspect, the present invention is directed to a method for fabricating a label for embedding in a secondary object. The method comprises the steps of depositing a photoaligning release material onto a substrate, creating diffractive waveplate photoalignment conditions on the photoalinging release material by subjecting it to a predetermined cycloidal polarization pattern, depositing a reactive liquid crystal film on the photoalignment layer according to the predetermined cycloidal polarization pattern, polymerizing the reactive liquid crystal film, releasing the polymerized liquid crystal film from the substrate, and transferring at least a portion of the released film to the secondary object.

In accordance with yet still another aspect, the present invention is directed to a method for fabricating the label from cycloidal diffractive waveplate flakes for embedding in a secondary object. The method comprises the steps of depositing a photoaligning release material onto a substrate, creating diffractive waveplate photoalignment conditions on the photoaligning release material by subjecting it to a predetermined cycloidal polarization pattern, depositing a reactive liquid crystal film on the photoalignment layer according to the predetermined cycloidal polarization pattern, polymerizing the reactive liquid crystal film, releasing the polymerized liquid crystal film from the substrate, creating flakes out of the polymerized liquid crystal film, and transferring at least a portion of the flakes to the secondary object.

The present invention is directed to contact lenses with embedded labels and methods for labeling them in such a manner that the label is only visible when the lens is off the eye. A contact lens or contact lenses in accordance with the present invention comprise an optical film embedded outside of the optical zone. The optical film may comprise a diffractive grating that diffracts light propagated through it, but no diffraction is visible in the light reflected from the grating thereby making it invisible to both the wearer and others when the lenses are on eye. Utilizing embedded labels comprised of diffractive waveplates provides the advantage of high efficiency broadband diffraction with thin film of continuous structure.

In accordance with the present invention, the functionality described above may be achieved by utilizing diffractive waveplates and other transmissive holography films. Diffractive waveplate labels provide a number of advantages, including the fact that very thin material layers may be utilized to obtain high contrast, the diffraction is broadband both spectrally and angularly, a wide range of diffractive structures are available, and the components allow for relatively inexpensive manufacturing.

It is important to note that the embedded labels in accordance with the present invention may be realized in any number of suitable ways. However, regardless of how the embedded labels are realized, the embedded labels comprise structures that are sensitive to the direction of light as is explained in detail herein. More broadly, the embedded labels comprise structures that influence the propagation of incident light. The embedded labels provide a low cost, easy to manufacture option for clearly identifying a contact lens.

BRIEF DESCRIPTION OF THE DRAWINGS

The foregoing and other features and advantages of the invention will be apparent from the following, more particular description of preferred embodiments of the invention, as illustrated in the accompanying drawings.

FIG. 8A is a diagrammatic representation of a vertically modulated cycloidal diffractive pattern on a homogenously oriented material background.

DETAILED DESCRIPTION OF THE PREFERRED EMBODIMENTS

Figure 1A:
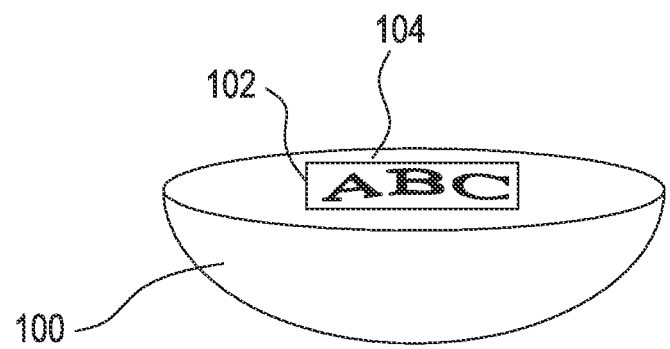
FIG. 1A is a diagrammatic representation of a visible label associated with a contact lens in accordance with the present invention.

Contact lenses or contacts are simply lenses placed on the eye. Contact lenses are considered medical devices and may be worn to correct vision and/or for cosmetic or other therapeutic reasons. Contact lenses have been utilized commercially to improve vision since the 1950s. Early contact lenses were made or fabricated from hard materials, were relatively expensive and fragile. In addition, these early contact lenses were fabricated from materials that did not allow sufficient oxygen transmission through the contact lens to the conjunctiva and cornea which potentially could cause a number of adverse clinical effects. Although these contact lenses are still utilized, they are not suitable for all patients due to their poor initial comfort. Later developments in the field gave rise to soft contact lenses, based upon hydrogels, which are extremely popular and widely utilized today. Specifically, silicone hydrogel contact lenses that are available today combine the benefit of silicone, which has extremely high oxygen permeability, with the proven comfort and clinical performance of hydrogels. Essentially, these silicone hydrogel based contact lenses have higher oxygen permeabilities and are generally more comfortable to wear than the contact lenses made of the earlier hard materials.

Currently available contact lenses remain a cost effective means for vision correction. The thin plastic lenses fit over the cornea of the eye to correct vision defects, including myopia or nearsightedness, hyperopia or farsightedness, astigmatism, i.e. asphericity in the cornea, and presbyopia i.e. the loss of the ability of the crystalline lens to accommodate. Contact lenses are available in a variety of forms and are made of a variety of materials to provide different functionality. Daily wear soft contact lenses are typically made from soft polymer materials combined with water for oxygen permeability. Daily wear soft contact lenses may be daily disposable or extended wear disposable. Daily disposable contact lenses are usually worn for a single day and then discarded, while extended wear disposable contact lenses are usually worn for a period of up to thirty days. Colored soft contact lenses use different materials to provide different functionality. For example, a visibility tint contact lens uses a light tint to aid the wearer in locating a dropped contact lens, enhancement tint contact lenses have a translucent tint that is meant to enhance one's natural eye color, the color tint contact lens comprises a darker, opaque tint meant to change one's eye color, and the light filtering tint contact lens functions to enhance certain colors while muting others. Rigid gas permeable hard contact lenses are made from siloxane-containing polymers but are more rigid than soft contact lenses and thus hold their shape and are more durable. Bifocal contact lenses are designed specifically for patients with presbyopia and are available in both soft and rigid varieties. Toric contact lenses are designed specifically for patients with astigmatism and are also available in both soft and rigid varieties. Combination lenses combining different aspects of the above are also available, for example, hybrid contact lenses.

Contact lenses need to be thin and flexible for comfort. Such flexibility may result in contact lens inversion upon handling. Accordingly, there is a need for marking the contact lenses with some form of indicia such that their normal or non-inverted state may be easily distinguished from the inverted state. In order not to affect the aesthetic and optical properties of the contact lens, the inversion marker is presently made in the form of a small number series at the periphery of each contact lens. This makes the marker barely visible, thus requiring special effort and/or adequate illumination to locate and identify the marks. An embedded label or indicia in accordance with the present invention that is highly visible and easily identifiable when the contact lens is out or off of the eye but is invisible on the eye is highly desirable. The embedded indicia may be utilized as an inversion marking, as a prescription label, as a brand label, as a cosmetic enhancer and/or for any other suitable means or functionality.

The present invention is directed to contact lenses incorporating one or more embedded structures that are sensitive to the direction of light. The one or more embedded structures influence the propagation of incident light on the contact lens. More specifically, the one or more embedded structures are sensitive to the direction of light and thus may be utilized for manipulating light to achieve the desired propagation effect. These structures do not need to form an image, but rather diffuse light across a range of angles so that the structures may be revealed across a range of angles, effectively providing excellent visibility regardless of the viewing angle.

Figure 1B:
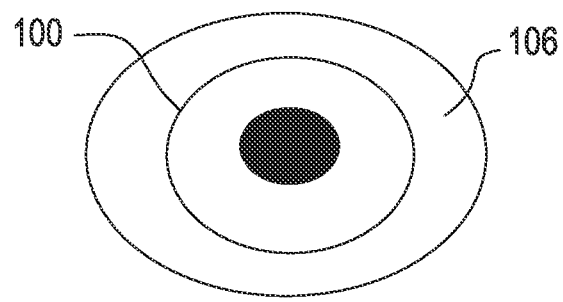
FIG. 1B is a diagrammatic representation of the contact lens of FIG. 1A positioned on-eye in accordance with the present invention.
Figure 2:
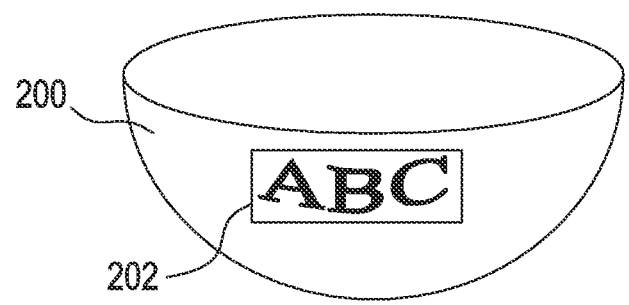
FIG. 2 is a diagrammatic representation of a label readable from the outside of a contact lens in accordance with the present invention.

Referring now to FIGS. 1A and 1B, there is illustrated a contact lens 100 comprising an embedded label 102 formed from diffractive areas 104. In this exemplary embodiment, the diffractive areas 104 are patterned in the form of the numeric sequence 123 and positioned outside of the optic zone of the contact lens 100. The diffraction of ambient light propagated through the diffractive areas 104 makes the pattern highly discernible, whereas the embedded label 102 is invisible when the contact lens 100 is positioned on the eye 106 due to the absence of light propagated through it as illustrated in FIG. 1B. As illustrated, no embedded label 102 is visible when the contact lens 100 is on eye 106. The embedded label 102 may comprise any suitable indicia such as the numbers illustrated, letters, signs, patterns, symbols and/or any combination thereof. In addition, the embedded label 102 may be inserted at different orientations relative to the contact lens 100. In FIG. 2, for example, the embedded label 202 is readable when looking at the outside surface of the contact lens 200 as opposed to the contact lens 100 in FIG. 1A where the embedded label 102 is readable when looking at the inside surface of the contact lens 100.

Figure 3:
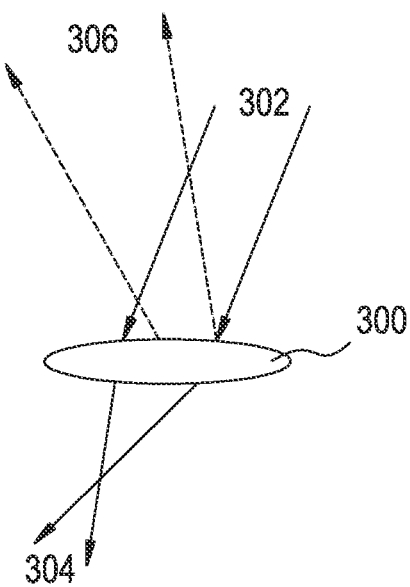
FIG. 3 is a diagrammatic representation of a transmissive optical element that visibly changes the light propagated therethrough but not the light reflected therefrom.

The general concept behind the present invention; namely, visibility with light transmitted through the label and invisibility with no light transmitted therethrough, may be explained utilizing a simple lens as an example. FIG. 3 illustrates such a lens 300. When propagated through the lens 300, incident light rays 302 undergo strong deviation from the initial propagation direction due to the focusing power of the lens 300 as evidenced by transmitted light rays 304. On the other hand, the reflected light 306 at the surface of the lens 300 is not strong enough to reveal the lensing action. Moreover, if the distance, a, between the object and a lens with focal length, f, is reduced such that a<<f (for example, if the lens is sitting directly on text), the distance of the formed image, b, becomes nearly equal to −a according to the lens equation, meaning the image coincides with the object. The situation is thus similar to looking at text through a simple glass window. A simple glass window is essentially a lens with an infinitely large focal length.

Accordingly, microlenses could be utilized as well as pixel elements for creating an embedded label in accordance with the concept of the present invention. However, it is generally not desired to create an additional surface profile, particularly for contact lenses. In addition, such a profile may not be even visible due to index matching with the storage solutions utilized in conjunction with contact lenses. Therefore, in a preferred exemplary embodiment, a hologram recorded on an appropriate medium may be utilized as an embedded label. Holography is a process whereby three-dimensional images may be created. Essentially, holography is a technique that enables light scattered off objects to be recorded and later reconstructed when the original light field is no longer present. There are a number of different types of holograms, for example, a transmission hologram and a polarization hologram. In addition, there are a number of ways of creating holograms as is discussed below.

Figure 4A:
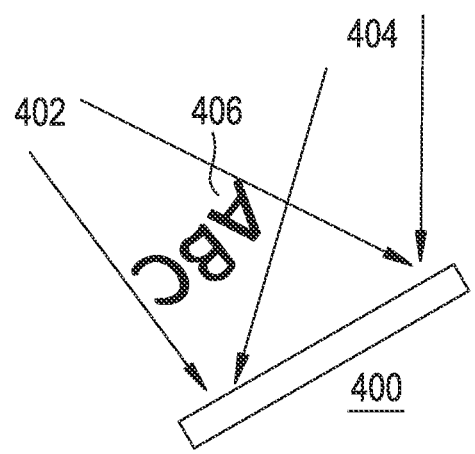
FIG. 4A is a diagrammatic representation of the recording of a hologram carrying information with two interfering light beams.
Figure 4B:
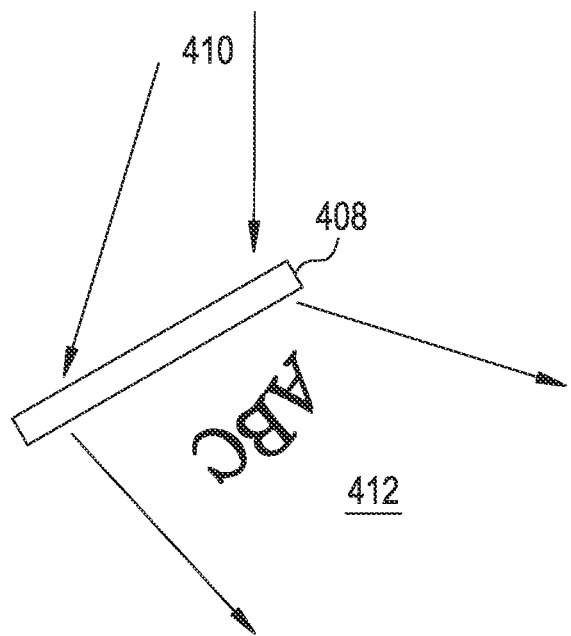
FIG. 4B a diagrammatic representation of the reading out of the information recorded in the hologram of FIG. 4A with an incident light transmitted therethrough.

In a preferred exemplary embodiment, as illustrated in FIG. 4A, instead of a lens as described above with respect to FIG. 3, a transmission hologram 400 is recorded by interfering object beam 402 and reference beam 404. The object 406 in this exemplary embodiment is the letter sequence ABC. A transmission hologram is one in which the object and reference beams are incident on the recording medium from the same side as illustrated in FIG. 4A. FIG. 4B illustrates the exemplary transmission hologram 400 on medium 408. The recorded transmission hologram 400 is generally a film with constant thickness and modulation of refractive index within the bulk of the medium 408. The holographically recorded pattern is restored in the presence of a reference beam 410 creating holographic image 412.

A holographic recording medium has to convert the original interference pattern into an optical element that modifies either the amplitude or the phase of the incident light in proportion to the intensity of the original light field. Holographic recording medium is preferably able to fully resolve all the fringes created as a result of the interferences between the object beam and the reference beam. If the response of the medium to the spatial frequencies, as determined from the fringe spacing, is low, the diffraction efficiency of the hologram is low and a dim image is obtained when the hologram is read. If the response of the medium is high, the diffraction efficiency of the hologram is high and a bright image is obtained. Exemplary recording materials include photographic emulsions, dichromated gelatin, photoresists, photothermoplastics, photopolymers, photorefractives liquid crystals and liquid crystal polymers.

Liquid crystals are materials that have properties between those of conventional liquid and those of solid crystal. There are numerous types of liquid crystal phases which may be distinguished by the different optical properties. Liquid crystals (LCs) and liquid crystal polymers (LCPs) are a particularly important class of materials for holographic recording for a number of reasons. Firstly, the modulation of the effective refractive index in LCs may be as high as 0.1 and that is at least one-hundred (100) times larger than for most other materials. Secondly, liquid crystal materials, low as well as high molecular weight, allow for versatility in developing holographic gratings to meet different sets of functional requirements. Thirdly, LCs are inexpensive and easily customizable. Holographic polymer dispersed liquid crystals (H-PDLCs) are an example of a holographic medium wherein index modulation is a result of the distribution of LC dispersed in a polymer matrix. These dispersions may be made using component pairs from a huge variety of liquid crystals and polymers, proceeding from index matching requirements. For example, nematic LC 4-Cyano-4'-pentylbiphenyl (5CB) may be paired with Norland adhesive NOA 65, in an approximately 1:1 ratio, and polymerized with interfering ultra violet (UV) beams at room temperature.

Figure 5:
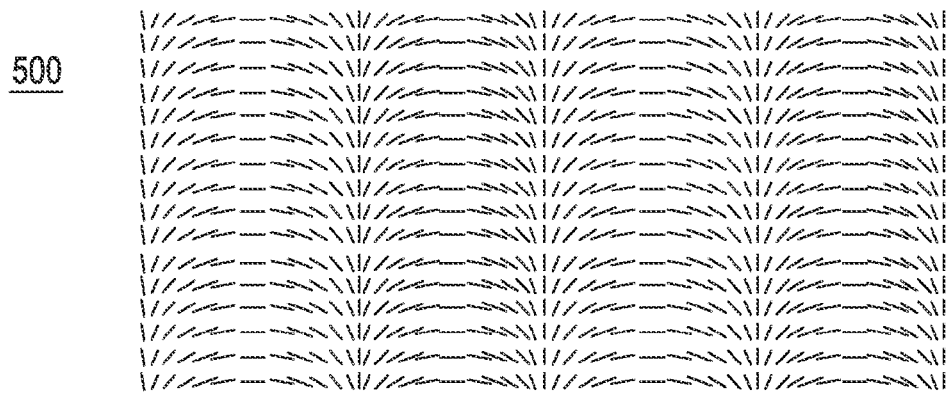
FIG. 5 is a diagrammatic illustration of the structure of a cycloidal diffractive waveplate.

Typically, transmission holograms are characterized by low diffraction efficiency and are spectrally selective. One critical advantage of LC materials is the possibility of recording polarization holograms by interfering light beams of orthogonal polarization states. The intensity remains constant in such a pattern, and the result of overlap is a modulation of light polarization in the overlap region of the beams. In the particularly important case of right- and left-circularly polarized beams, the effective polarization in the overlap region is linear, rotating in space in a pattern as illustrated in FIG. 5 and discussed in greater detail below. This polarization pattern may yield an accordingly modulated optical axis in so-called photoanisotropic materials. Examples of such photoanisotropic media include, for example, malachite dye in bichromic gelatine and, of more importance for the preferred embodiment, azobenzene dye doped polymers, for example, Methyl Red doped PVA. A large variety of photoanisotropic materials are known currently, based on azobenzene polymers, polyesthers, photo-crosslinkable polymer liquid crystals with mesogenic 4-(4-methoxycinnamoyloxy)biphenyl side groups and the like. A special class of such materials is known as photoalignment materials since they are used in thin film coatings to create anisotropic boundary conditions for alignment of liquid crystals and liquid crystal polymers. Examples of such materials include sulfonic bisazodye SD1 and other azobenzene dyes, particularly, PAAD-series materials available from BEAM Engineering for Advanced Measurements Co. (BEAMCO), Poly(vinyl cinnamates), and others.

A special variety of polarization holograms; namely, cycloidal diffractive waveplates (CDW), provide substantially one hundred (100) percent diffraction efficiency and may be spectrally broadband. The structure of cycloidal diffractive waveplates, schematically illustrated in FIG. 5, comprises anisotropic material film 500, wherein the optical axis orientation is continuously rotating in the plane of the film 500. Nearly one hundred percent efficiency for visible wavelengths is achieved at fulfillment of half-wave phase retardation condition typically met in approximately one micrometer (0.001 mm) thick liquid crystal polymer (LCP) films.

Such an unusual situation in optics where a thin grating exhibits high efficiency, may be understood by considering a linearly polarized light beam of wavelength $\lambda$ incident normally, along the z-axis, on a birefringent film in the x,y plane. If the thickness of the film L and its optical anisotropy, $\Delta n$, are chosen such that $L\Delta n = \lambda/2$, and its optical axis is oriented at forty-five (45) degrees, angle $\alpha$, with respect to the polarization direction of the input beam, the polarization of the output beam is rotated by ninety (90) degrees, angle $\beta$. This is how half-wave waveplates function. The polarization rotation angle at the output of such a waveplate, $\beta = 2\alpha$, depends on the orientation of the optical axis $d=(d_x, d_y)=(\cos\alpha, \sin\alpha)$. Liquid crystal materials, both low molecular weight as well as polymeric, allow continuous rotation of d in the plane of the waveplate at high spatial frequencies, $\alpha = qx$, where the spatial modulation period $\Lambda = 2\pi/q$ may be comparable to the wavelength of visible light. Polarization of light at the output of such a waveplate is consequently modulated in space, $\beta = 2qx$, and the electric field in the rotating polarization pattern at the output of this waveplate is averaged out, $<E>=0$, and there is no light transmitted in the direction of the incident beam. The polarization pattern thus obtained corresponds to the overlap of two circularly polarized beams propagating at the angles $\pm\lambda/\Lambda$. Only one of the diffraction orders is present in the case of a circularly polarized input beam, the +1st or −1st, depending on whether the beam is right or left handed.

Fabrication of LC and LC polymer diffractive waveplates is a multistep process. The technology for printing cycloidal diffractive waveplates from a master waveplate is best fit for large-scale production with high quality and large areas, avoiding all complexity, cost and the stability problems of holographic setups. The printing technique makes use of the rotating polarization pattern obtained at the output of the master cycloidal diffractive waveplate from a linearly or circularly polarized input beam. The period of the printed waveplates is doubled when one uses a linearly polarized input beam. As compared to direct recording in photoanisotropic materials, liquid crystal polymer technology based on photoalignment has an advantage of commercial availability of LCPs, for example, from Merck. A typical LCP, reactive mesogens in Merck nomenclature, such as RMS-001C, is spin coated (typically three thousand (3000) rpm for sixty (60) s) on a photoalignment layer and UV polymerized for approximately ten (10) minutes. More than a single layer is coated for broadband diffraction or for adjusting the peak diffraction wavelength.

Figure 6A:
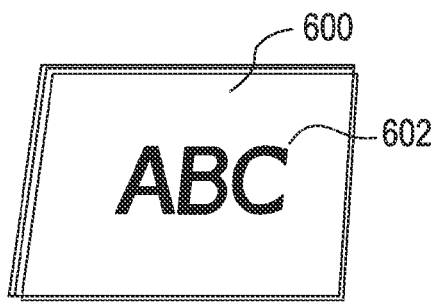
FIG. 6A is a diagrammatic representation of a cycloidal diffractive waveplate positioned above text.
Figure 6B:
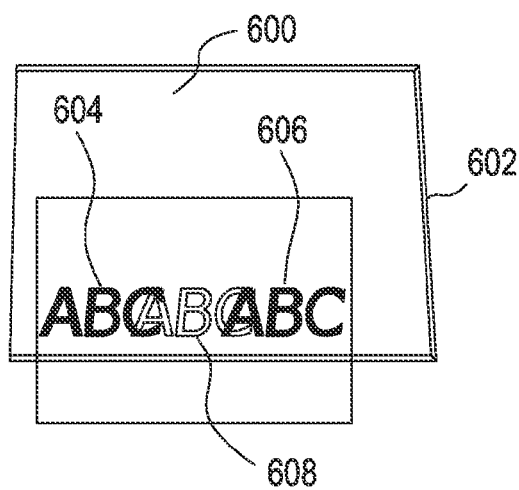
FIG. 6B is a diagrammatic representation of a cycloidal diffractive waveplate positioned on the text of FIG. 6A.

A liquid crystal polymer cycloidal diffractive waveplate film coated on a glass substrate 600 is illustrated in FIG. 6A positioned on top of a text covered item 602. FIG. 6A demonstrates that the liquid crystal polymer cycloidal diffractive waveplate film does not affect the image of the text that it is seated or positioned on. In the instance, however, when the holographic recording or label is observed through the liquid crystal polymer cycloidal diffractive waveplate film of high diffraction efficiency, the diffraction splits the image of the text laterally into the $+1/-1^{st}$ orders 604 and 606 with low intensity transmitted central part 608 as illustrated in FIG. 6B.

Figure 7A:
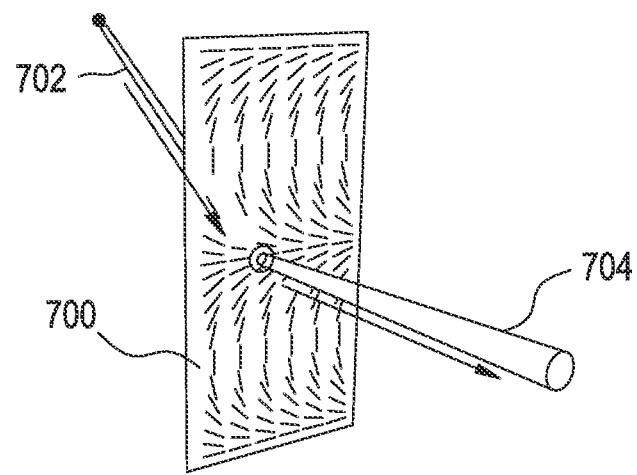
FIG. 7A is a diagrammatic illustration of the diffraction of a light beam on a cycloidal diffractive waveplate in a vertical orientation.
Figure 7B:
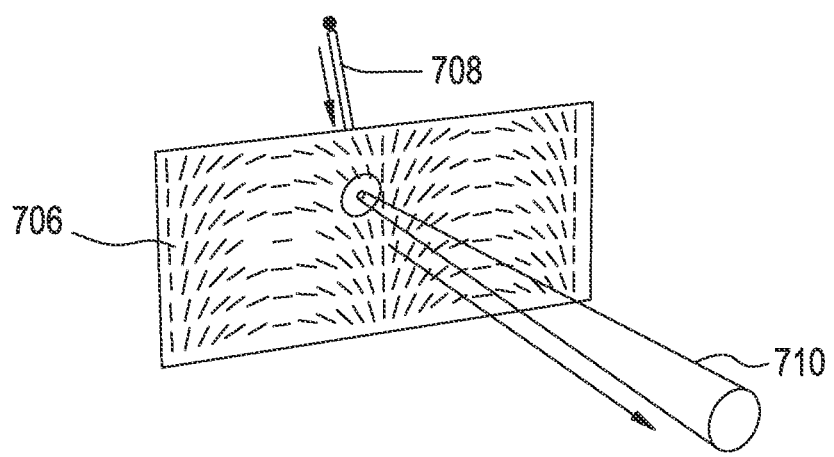
FIG. 7B is a diagrammatic illustration of the diffraction of a light beam on a cycloidal diffractive waveplane in a horizontal orientation.

Different orientations of the cycloidal diffractive waveplates, for example, vertical, horizontal or any other orientation therebetween may be utilized for maximizing the visibility of the label or indicia under common illumination conditions. Referring to FIG. 7A, there is illustrated a vertically oriented cycloidal diffractive waveplate 700. A vertical alignment of the cycloidal diffractive waveplate 700 maximizes the visibility for a skylight or ceiling light 702 by diffracting the incident light onto a beam 704 towards the eye. FIG. 7B illustrates a horizontally oriented cycloidal diffractive waveplate 706. A horizontal, alignment of the cycloidal diffractive waveplate 706 maximizes the visibility for light from windows 708, computer screens and the like by diffracting the incident light onto a beam 710 towards the eye.

Figure 8B:
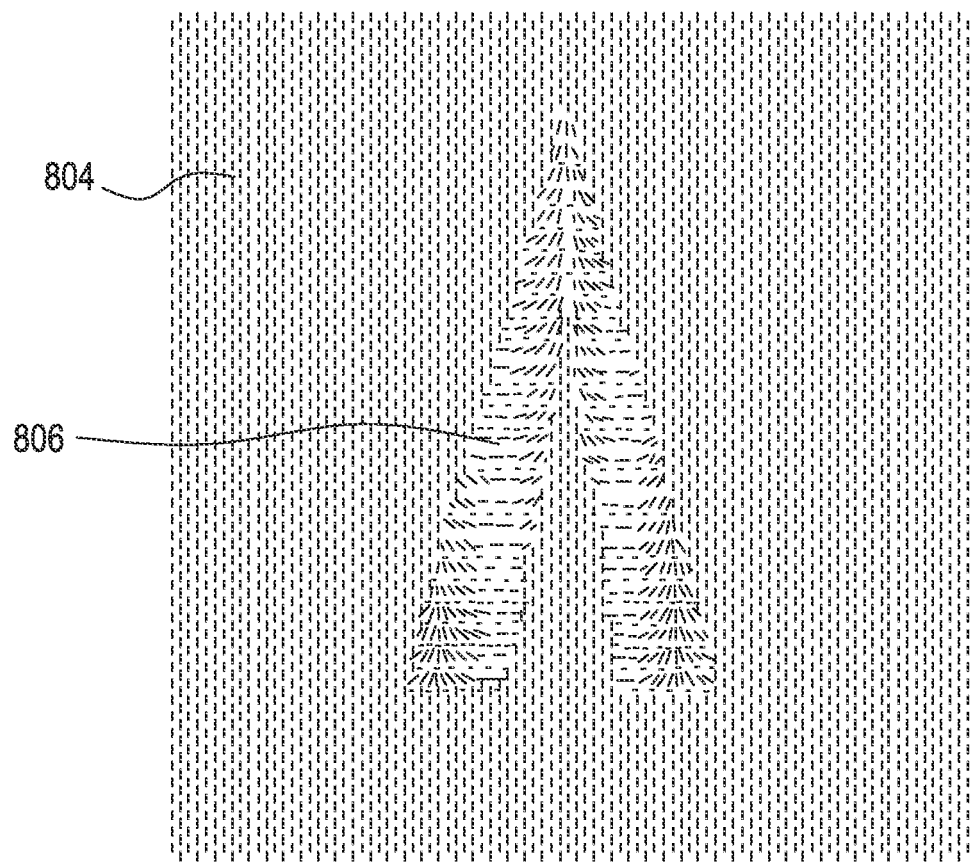
FIG. 8B is a diagrammatic representation of a horizontally modulated cycloidal diffractive pattern on a homogenously oriented material background.
Figure 8C:
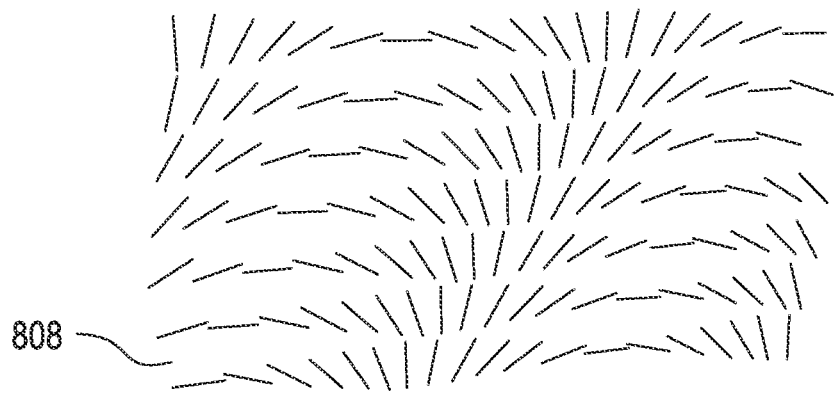
FIG. 8C is a diagrammatic representation of a two-dimensionally modulated cycloidal diffractive pattern.
Figure 8D:
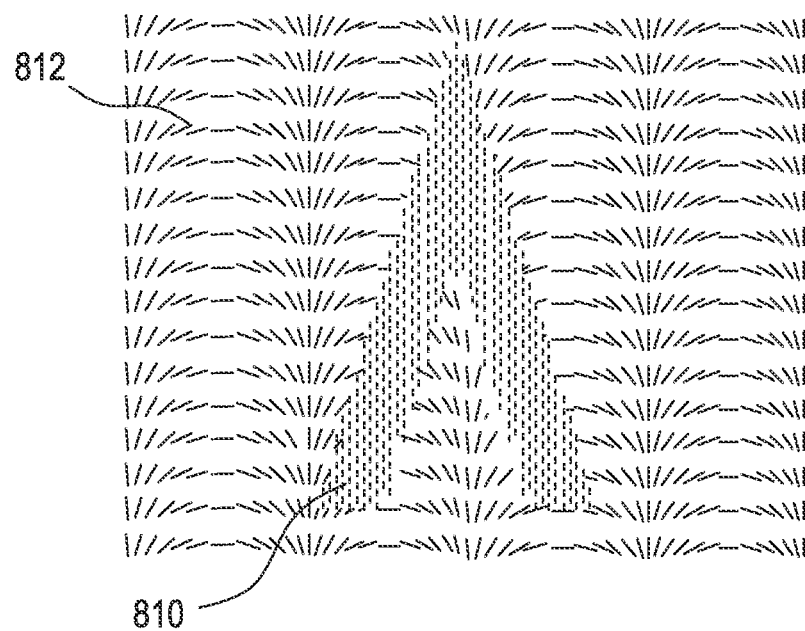
FIG. 8D is a diagrammatic representation of a horizontally modulated cycloidal diffractive background with a homogenously oriented pattern.

FIGS. 8A and 8B illustrate the vertical and horizontal alignment of cycloidal diffractive waveplates for a sample label 800. FIG. 8A illustrates a vertical alignment of the CDW pattern 802 from the sample label 800. The background of the cycloidal diffractive waveplate pattern 804 preferably comprises a non-diffractive transparent area with homogenously oriented optical axis or an isotropic area. This type of background is required for fabrication of high quality haze-free labels. FIG. 8B illustrates a horizontal alignment of the cycloidal diffractive waveplate pattern 806 from the sample label 800. The background of the cycloidal diffractive waveplate pattern 804 is the same as described above. A two-dimensional modulation of the optical axis orientation in a cycloidal diffractive waveplate 808 as illustrated in FIG. 8C may be utilized to provide a two-dimensional diffraction pattern to make it responsive to light sources in multiple locations or from light in different directions. FIG. 8D is different than FIGS. 8A-8C in that in this illustrated exemplary embodiment, the background 812 is diffractive while the label or letter 810 has homogenous orientation of the optical axis or it is optically isotropic. In other words, the exemplary embodiment of FIG. 8D is opposite the exemplary embodiments of FIGS. 8A and 8B. Accordingly, when looking through a contact lens to a light source, the label itself would appear having bright letters.

The label 800 illustrated in FIGS. 8A and 8B may be created or obtained in a number of ways. In one exemplary embodiment, a label such as the one illustrated in FIGS. 8A and 8B may be generated or created by utilizing a polarization holography technique in conjunction with a mask. The overall process comprises a number of steps. In a first step, a photoaligning release material is deposited onto a substrate. In the next step, the photoaligning release material is prealigned with a linearly polarized light. In the next step, a mask with a particular pattern formed therein is arranged between the light sources for creating the holographic image at the substrate. The mask defines the object for the recorded image. In the next step, the photoaligning release material on the substrate is exposed to interfering light beams of orthogonal polarization states through the mask. In the next step, the photoaligning release layer on the substrate is coated with a reactive liquid crystal film. In the next step, the liquid crystal film is polymerized. In the next step, the polymerized liquid crystal film is released from the substrate and may be utilized for any suitable application.

Figure 9:
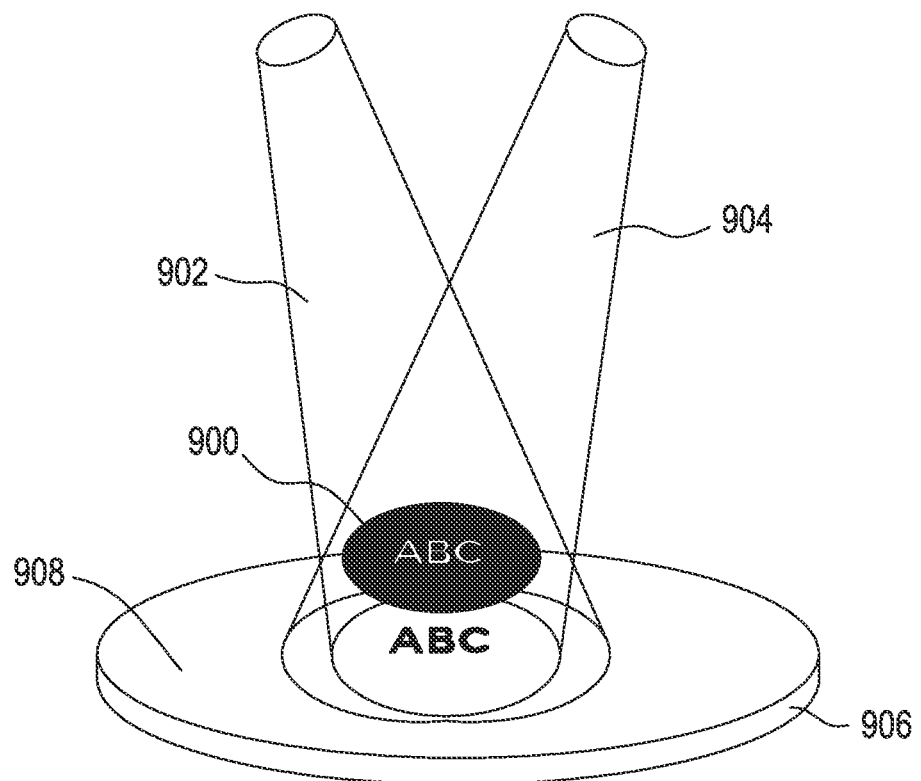
FIG. 9 is a diagrammatic representation of the recording of a cycloidal diffractive waveplate through a mask with interfering light beams in accordance with the present invention.

A more particular description is given with respect to FIG. 9. As illustrated, the mask 900 is positioned between the light sources (not illustrated) creating beams 902 and 904 and the substrate 906. The recording beams 902 and 904 may be of orthogonal, particularly, circular polarization. By utilizing the mask 900, the substrate 906 carrying the photoalignment layer 908 is thus exposed to a polarization modulation pattern only in the area corresponding to the label. However, prior to this step, the whole area of the photoalignment layer shall be prealigned with a linearly polarized light. In a preferred exemplary embodiment, PAAD series materials are utilized for the photoalignment. PAAD series materials are available from BEAM CO., Winter Park, Fla., and are based on azobenzene. Due to their property of reversibility, the PAAD series material may be first homogenously aligned before exposing it to the polarization modulation pattern. Due to high photosensitivity to visible wavelengths, the photoalignment of PAAD series materials may be carried out using visible light sources, for example, four hundred twenty (420) nm in wavelength and with a low exposure time. In addition, PAAD series materials may also act as release layers for the final product; namely, the labeled film. The labeled film may be obtained by coating the photoaligned substrate with a polymerizable liquid crystal and polymerizing it in an unpolarized light. Reactive mesogens available from Merck & Co. may be utilized for obtaining a liquid crystal polymer layer. BEAM Co's polymerizable liquid crystal materials present an alternative with the advantage of providing visible diffraction with a single coating and due to providing high diffraction efficiency high quality texture-free film. To produce a fully transparent haze-free label, the photoalignment layer needs to first be photoaligned homogeneously in a given direction by exposing it to a linear polarized light. The cycloidal pattern is then printed on the layer due to reversibility of azobenzene-based photoalignment materials. The exposure conditions for homogenous and cycloidal alignment may vary. For example, the homogeneous photoalignment may be performed with a linear polarized UV light whereas the cycloidal pattern may be printed by a visible beam. The exposure doses would depend on the specific material used in the process. Typically, for PAAD series of materials, for example, the photoalignment with a visible beam may be achieved with even as short as one to ten minute exposure at ten (10) mW/cm² power density level. This time is further reduced for higher power density light beams.

In an alternate exemplary embodiment, the label may be created or obtained utilizing a single light beam and a polarization modulator. Once again the overall process comprises a number of steps. In a first step, a photoaligning release material is deposited onto a substrate. In the next step, the photoaligning release material is prealigned with a linearly polarized light. In the next step, a masked diffractive waveplate is arranged between the light source and the substrate. In the next step, the photoaligned release material on the substrate is exposed to the light from a single source through the masked diffractive waveplate. In the next step, the substrate with the photoaligned release material on the substrate is coated with a reactive liquid crystal film. In the next step, the reactive liquid crystal film is polymerized. In the next step, the polymerized liquid crystal polymer film is released from the substrate and may be utilized for any suitable application.

Figure 10:
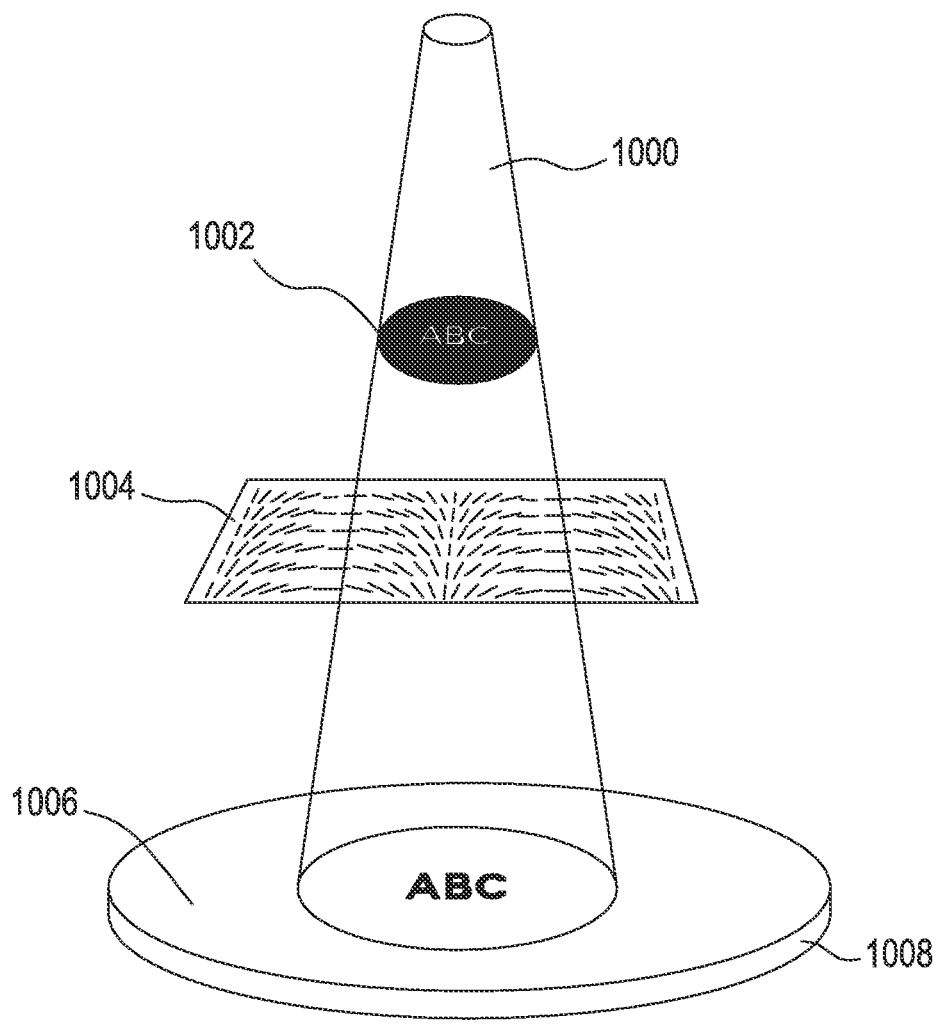
FIG. 10 is a diagrammatic representation of the printing of a cycloidal diffractive waveplate label through a mask and a master cycloidal diffractive waveplate acting as a polarization converter in accordance with the present invention.

A more particular description is given with respect to FIG. 10. FIG. 10 illustrates an arrangement in accordance with this alternate exemplary embodiment. As illustrated in FIG. 10, the single light beam 1000 is incident on mask 1002 which is positioned above the polarization modulator 1004. The polarization modulator 1004, for example, a cycloidal diffractive waveplate, provides the diffractive property of the pattern obtained at the photoalignment layer 1006 which is supported by substrate 1008. The substrate 1008 may comprise any suitable material, for example, a polymer film. It is important to note that the diffractive waveplate may be shaped into a mask. The mask 1002, the polarization modulator 1004 and the substrate 1008 are preferably in close proximity to one another in the fabrication process in a way similar to how contact lithography or a projection system may be utilized. The arrangement in FIG. 10 is exaggerated in size to provide for ease of explanation.

Figure 11A:
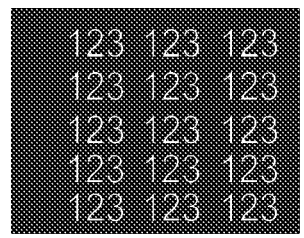
FIG. 11A is a diagrammatic representation of cycloidal diffractive waveplate labels on a substrate between crossed polarizers.
Figure 11B:
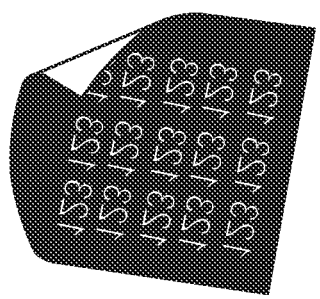
FIG. 11B is a diagrammatic representation of a polymer film carrying the labels separated from the glass between crossed polarizers.
Figure 11C:
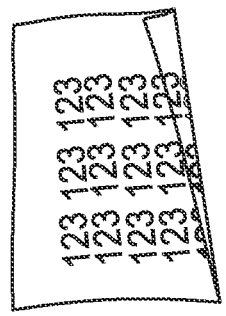
FIG. 11C is a diagrammatic representation of the polymer film with no polarizers.
Figure 14A:
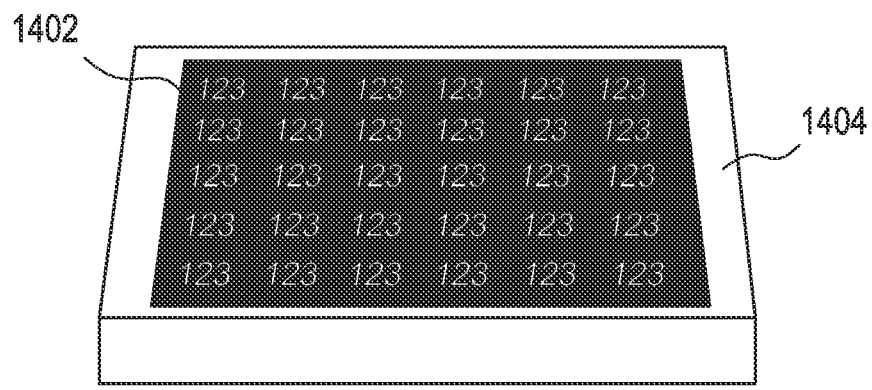
FIGS. 14A and 14B are a diagrammatic representation of the process of removing a polymer film comprising a series of printed labels from a substrate in accordance with the present invention.
Figure 14B:
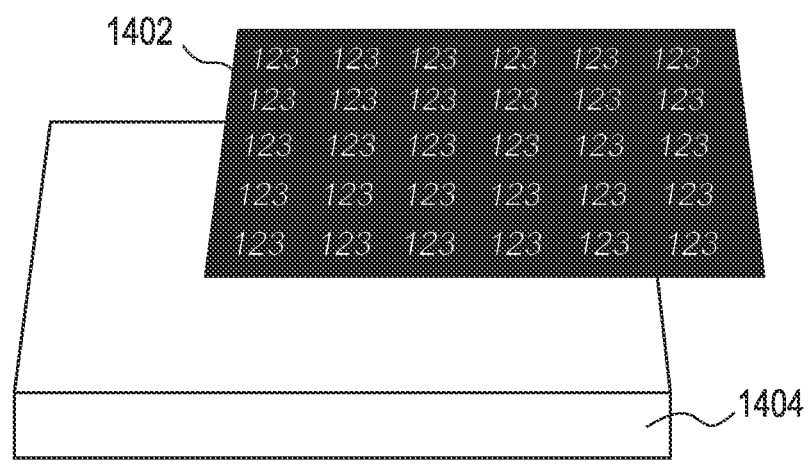

FIGS. 11A, 11B and 11C illustrate various views of an array of cycloidal diffractive waveplate labels obtained first on glass and then transferred to a thin support polymer film. FIGS. 11A and 11B illustrate the labels as viewed between crossed polarizers, hence the dark background. Since the cycloidal diffractive waveplates modulate the polarization state of light propagated therethough, the label 1100 appears bright between the crossed polarizers. However, without polarizers, the labels 1100 appear darker than the background due to diffraction of light out of the field of view as illustrated in FIG. 11C. Essentially, with this technique, white-on-white labels and/or black-on-white labels may be easily fabricated. This provides the designer with the option of creating a label which is more readable and/or aesthetically pleasing for a given background. FIGS. 14A and 14B are a diagrammatic representation of the process of removing a polymer film comprising a series of printed labels from a substrate in accordance with the present invention. In FIG. 14A, the polymer film comprising a series of printed labels 1402 is shown mounted on a substrate 1404. The substrate 1404 supports the polymer film 1402 during the fabrication process. FIG. 14B illustrates the polymer film 1402 separated from the substrate 1404 for transfer onto another object, for example, a support film or a contact lens.

Figure 12:
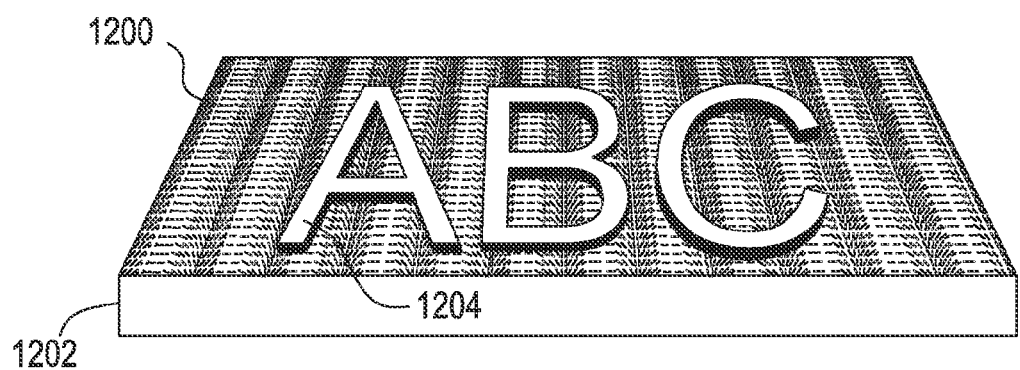
FIG. 12 is a diagrammatic representation of the fabrication process of the contact lens label by patterning reactive liquid crystal on a cycloidally photoaligned substrate followed by polymerization and release in accordance with the present invention.
Figure 12:
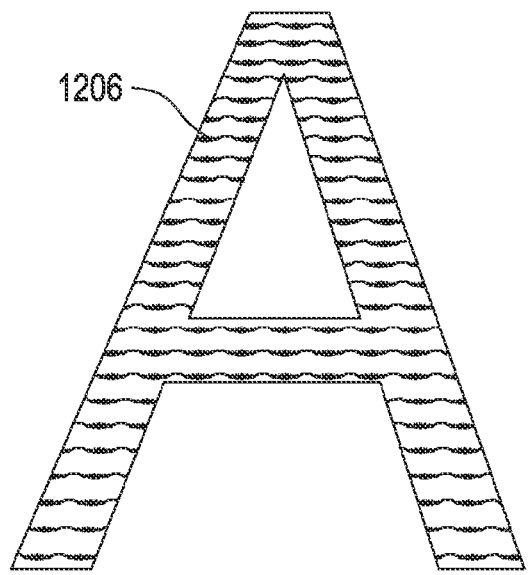

In accordance with yet another alternate exemplary embodiment of the method of fabrication of embedded labels, diffractive waveplate photoalignment conditions are created on the photoalignment layer directly. Once again, the process involves a number of steps. In a first step, a photoaligning release material is deposited onto a substrate. In the next step, diffractive waveplate photoalignment conditions are created on the photoalignment layer by subjecting it to a cycloidal polarization pattern. In the next step, a reactive liquid crystal according to the desired pattern is deposited on the photoalignment layer. In the next step, the reactive liquid crystal is polymerized. In the next step, the label is released by dissolving the photoaligning release film using a solvent, for example, water. The resulting label may be utilized in any number of suitable applications. FIG. 12 illustrates this process in more detail. The photoalignment layer 1200 is patterned cycloidally over the whole area coating on the substrate 1202 followed by printing the liquid crystal monomer 1204 according to the pattern comprising the label as illustrated in FIG. 12. Polymerization of the monomer allows for releasing the pattern for transfer onto a contact lens as illustrated in FIG. 2. Transferring the label 1206 onto a contact lens in the form of separate letters, numbers, signs and/or symbols offers the advantage of reduced stresses on the contact lens structure and the reduced effect of the label on the mechanical properties of the lens that otherwise may lead to a change of shape and buckling, particularly for the large label size.

It is important to note that in any of the above exemplary processes that although a single substrate is utilized, individual labels may be easily separated and applied to any suitable structure, for example, a contact lens. Once a set of labels comprising the patterned hologram on a support substrate are formed, the label may be transferred onto the non-optical zone of the inner surface of the contact lens in the molding process. Then the lens is simply hydrated and packaged.

Figure 13:
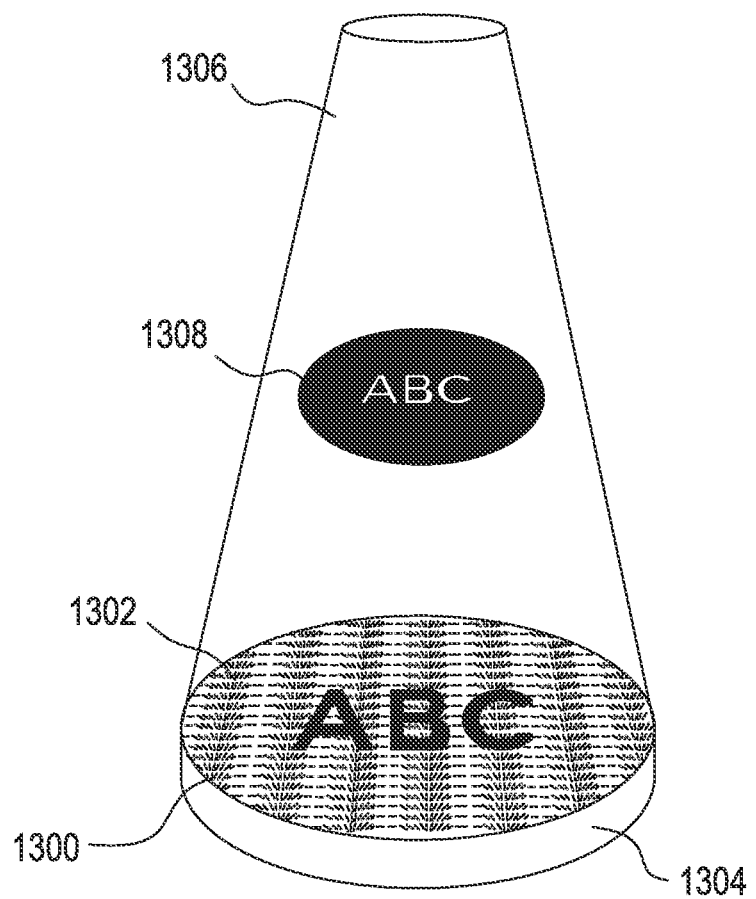
FIG. 13 is a diagrammatic representation of an alternate fabrication process of a contact lens label in accordance with the present invention.

In accordance with still another exemplary embodiment for the fabrication of embedded labels, a liquid crystal monomer 1300 is coated over the whole area of cycloidally photoaligned film 1302, which is on substrate 1304, and is polymerized by light 1306 through mask 1308 according to the label pattern as illustrated in FIG. 13. The unpolymerized portions of the pattern are then washed away by a solvent, thereby releasing the label. The advantage of this method is that no printing of the monomer is required, thereby simplifying the deposition process.

Rather than transferring labels in whole or in part, the labels may be printed directly onto a contact lens utilizing small cycloidal diffractive waveplate flakes and/or pigments. The flakes and/or pigments may be obtained, for example, in a process similar to the printing process as illustrated and described with respect to FIG. 12. The size and shape of the cycloidal diffractive waveplate flakes and/or pigments may be controlled both by varying printing condition or polymerization conditions to fit, for example, stamps already used in production. By creating these flakes and/or pigments, one may minimize the stress differences between dissimilar materials. When a larger film is utilized and it is incorporated into another structure, for example, a contact lens, which is formed from a different material, stresses are created. However, when the size of the film is reduced, for example, by creating flakes and/or pigments, the stress may be reduced.

The embedded label may comprise a thin film as set forth herein and also include one or more protective layers. The one or more protective layers may themselves be thin films. The embedded label may also comprise functional materials, including photochromic materials and therapeutic agents.

Once a label is fabricated by generating a patterned hologram on a support substrate, it may be incorporated into the contact lens. Generally speaking, the label is simply transferred and positioned in the desired location of the lens mold in a standard lens fabrication technique. Preferably, the label is positioned in the peripheral portion or zone of the lens rather than in the optic zone.

It is important to note that the fabrication processes for the labels set forth herein may be utilized in conjunction with any number of structures. For example, the labels may be embedded in high end watches or bottles for wine or spirits. Additionally, cycloidal diffractive waveplate flakes and/or pigments may be utilized in a similar manner.

Although shown and described is what is believed to be the most practical and preferred embodiments, it is apparent that departures from specific designs and methods described and shown will suggest themselves to those skilled in the art and may be used without departing from the spirit and scope of the invention. The present invention is not restricted to the particular constructions described and illustrated, but should be constructed to cohere with all modifications that may fall within the scope of the appended claims.

What is claimed is:

1. An ophthalmic lens with embedded label, the ophthalmic lens comprising:
    a contact lens; and
    one or more embedded structures that are sensitive to the direction of incident light incorporated into the contact lens, the one or more embedded structures comprising diffractive gratings.

2. The ophthalmic lens according to claim 1, wherein the one or more embedded structures comprise holographic recordings.

3. The ophthalmic lens according to claim 2, wherein the holographic recordings are revealed only in transmitted light.

4. The ophthalmic lens according to claim 2, wherein the holographic recordings comprise polarization holograms.

5. The ophthalmic lens according to claim 4, wherein the polarization holograms comprise diffractive waveplates.

6. The ophthalmic lens according to claim 5, wherein the diffractive waveplates are spectrally broadband.

7. The ophthalmic lens according to claim 5, wherein the diffractive waveplates comprise cycloidal diffractive waveplates.

8. The ophthalmic lens according to claim 2, wherein the holographic recordings are configured for diffraction in at least one of the vertical plane, the horizontal plane or a combination thereof.

* * * * *